United States Patent
Lu et al.

(10) Patent No.: US 12,315,846 B2
(45) Date of Patent: May 27, 2025

(54) ELECTRONIC DEVICE HAVING TWO GROUPS OF LIGHT-EMITTING UNITS

(71) Applicant: Innolux Corporation, Miao-Li County (TW)

(72) Inventors: Wei-Yi Lu, Miao-Li County (TW); Hao-Yu Liou, Miao-Li County (TW); Chung-Kuang Wei, Miao-Li County (TW); Chih-Yung Hsieh, Miao-Li County (TW); Ruey-Jer Weng, Miao-Li County (TW); Naoki Sumi, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 709 days.

(21) Appl. No.: 17/523,926

(22) Filed: Nov. 11, 2021

(65) Prior Publication Data

US 2022/0199588 A1   Jun. 23, 2022

Related U.S. Application Data

(60) Provisional application No. 63/128,870, filed on Dec. 22, 2020.

(30) Foreign Application Priority Data

Aug. 18, 2021   (CN) .......................... 202110948771.3

(51) Int. Cl.
  *H01L 25/075*   (2006.01)
  *G02B 3/00*   (2006.01)
  *H10H 20/855*   (2025.01)

(52) U.S. Cl.
  CPC .......... *H01L 25/0753* (2013.01); *G02B 3/005* (2013.01); *H10H 20/855* (2025.01)

(58) Field of Classification Search
  CPC .................................................... G02B 3/005
  See application file for complete search history.

(56) References Cited

U.S. PATENT DOCUMENTS

| | | | |
|---|---|---|---|
| 2004/0257495 A1* | 12/2004 | Hattori | H04N 13/32 348/E13.043 |
| 2009/0316067 A1* | 12/2009 | Lee | H01J 61/0672 313/494 |

(Continued)

FOREIGN PATENT DOCUMENTS

| | | |
|---|---|---|
| CN | 102566110 | 7/2012 |
| CN | 108020928 | 5/2018 |
| CN | 208569259 | 3/2019 |

OTHER PUBLICATIONS

"Office Action of China Counterpart Application", issued on Mar. 18, 2024, p. 1-p. 7.

*Primary Examiner* — Jay C Chang
*Assistant Examiner* — Mikka Liu
(74) *Attorney, Agent, or Firm* — JCIPRNET

(57) ABSTRACT

The disclosure provides an electronic device and a display method thereof. The electronic device includes a display panel and a light source module. The light source module is disposed at a side of the display panel. The light source module includes a first group of light-emitting units and a second group of light-emitting units that are alternately arranged, wherein the first group of light-emitting units and the second group of light-emitting units emit a light alternately, and each of a plurality of display pixels is adapted to alternately receive the light from the first group of light-emitting units and the second group of light-emitting units.

13 Claims, 11 Drawing Sheets

(56) References Cited

U.S. PATENT DOCUMENTS

2019/0179591 A1\* 6/2019 Kuo ....................... H10K 59/18
2019/0355704 A1\* 11/2019 Cheng ................. H01L 25/0753

\* cited by examiner

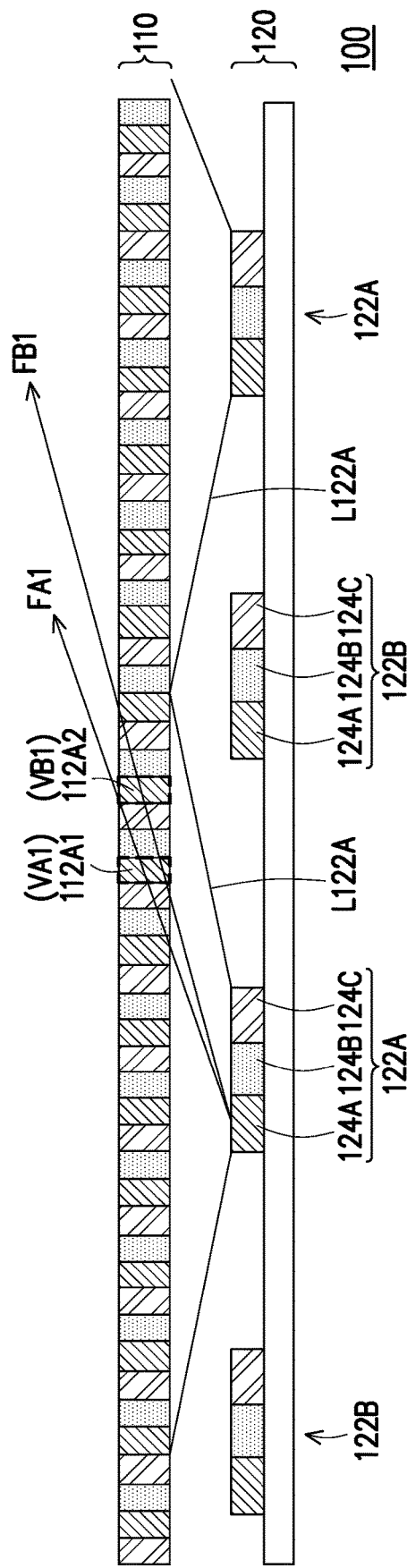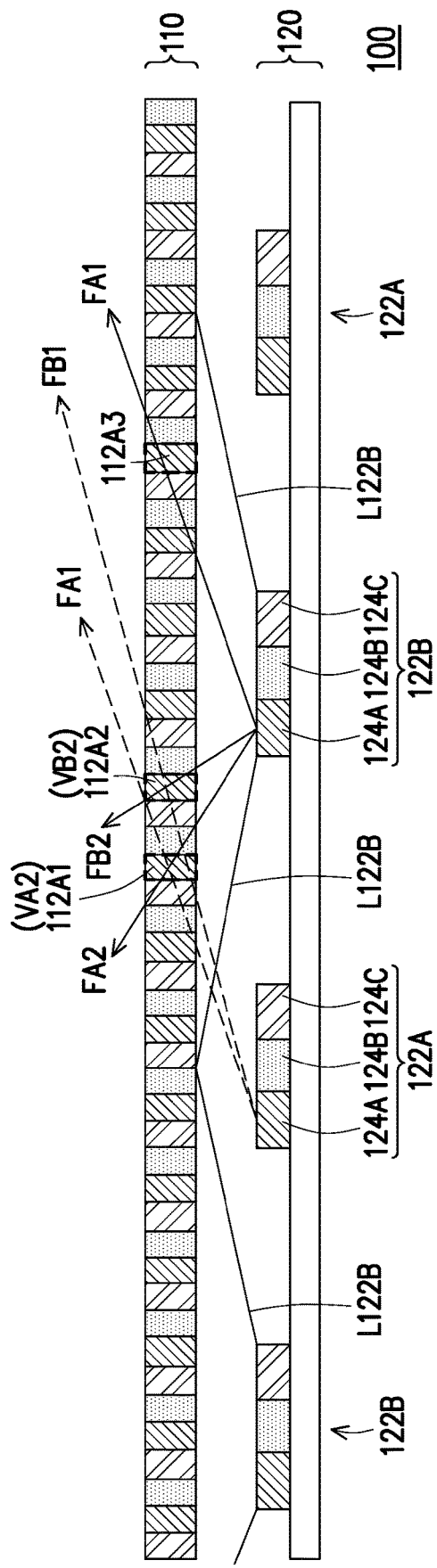

ELECTRONIC DEVICE HAVING TWO
GROUPS OF LIGHT-EMITTING UNITS

CROSS-REFERENCE TO RELATED
APPLICATION

This application claims the priority benefit of U.S. provisional application Ser. No. 63/128,870, filed on Dec. 22, 2020, and China application serial no. 202110948771.3, filed on Aug. 18, 2021. The entirety of each of the above-mentioned patent applications is hereby incorporated by reference herein and made a part of this specification.

BACKGROUND OF THE DISCLOSURE

Field of the Disclosure

The disclosure relates to an electronic device and a display method of the electronic device.

Description of Related Art

Electronic devices with display functions are constantly trending towards higher picture quality, more diverse display effects, and more realistic display pictures. In recent years, in addition to a higher-quality flat-panel display effect, the stereoscopic visual effect, the stereoscopic display effect, and the immersive display effect produced by a plurality of single-sided images are continuously being improved. Stereoscopic display effects may be achieved by a light field display (LfD) technique. For example, the LfD technique may include high speed spin, multi-projector, directional backlight, multi layer display, parallax barrier, pinhole array, and lens array. However, various three-dimensional display techniques still have room for improvement. Taking the directional light source design as an example, light from different directions provided by a directional light source may interfere with each other and cause the issue of image crosstalk.

SUMMARY OF THE DISCLOSURE

The disclosure is directed to an electronic device that may achieve a good stereoscopic visual effect or stereoscopic display effect.

According to an embodiment of the disclosure, an electronic device includes a display panel and a light source module. The light source module is disposed at a side of the display panel. The light source module includes a first group of light-emitting units and a second group of light-emitting units that are alternately arranged, wherein the first group of light-emitting units and the second group of light-emitting units emit a light alternately, and each of the plurality of display pixels alternately receives the light from the first group of light-emitting units and the second group of light-emitting units.

According to an embodiment of the disclosure, a display method of an electronic device includes: providing an electronic device, wherein the electronic device includes a display panel and a light source module disposed at a side of the display panel, the display panel includes a plurality of display pixels, and the light source module includes a first group of light-emitting units and a second group of light-emitting units that are alternately arranged; making the first group of light-emitting units and the second group of light-emitting units alternately emit a light; and making each of the plurality of display pixels alternately display a first view field image information and a second view field image information.

Based on the above, the electronic device of an embodiment of the disclosure has different groups of light-emitting units that may be operated independently, and the display method of the electronic device includes making the different groups of light-emitting units alternately emit light. The electronic device may achieve a good stereoscopic display effect.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 2 and FIG. 3 are schematic diagrams of a display method of an electronic device in different display modes of an embodiment of the disclosure.

DESCRIPTION OF THE EMBODIMENTS

Figure 1:
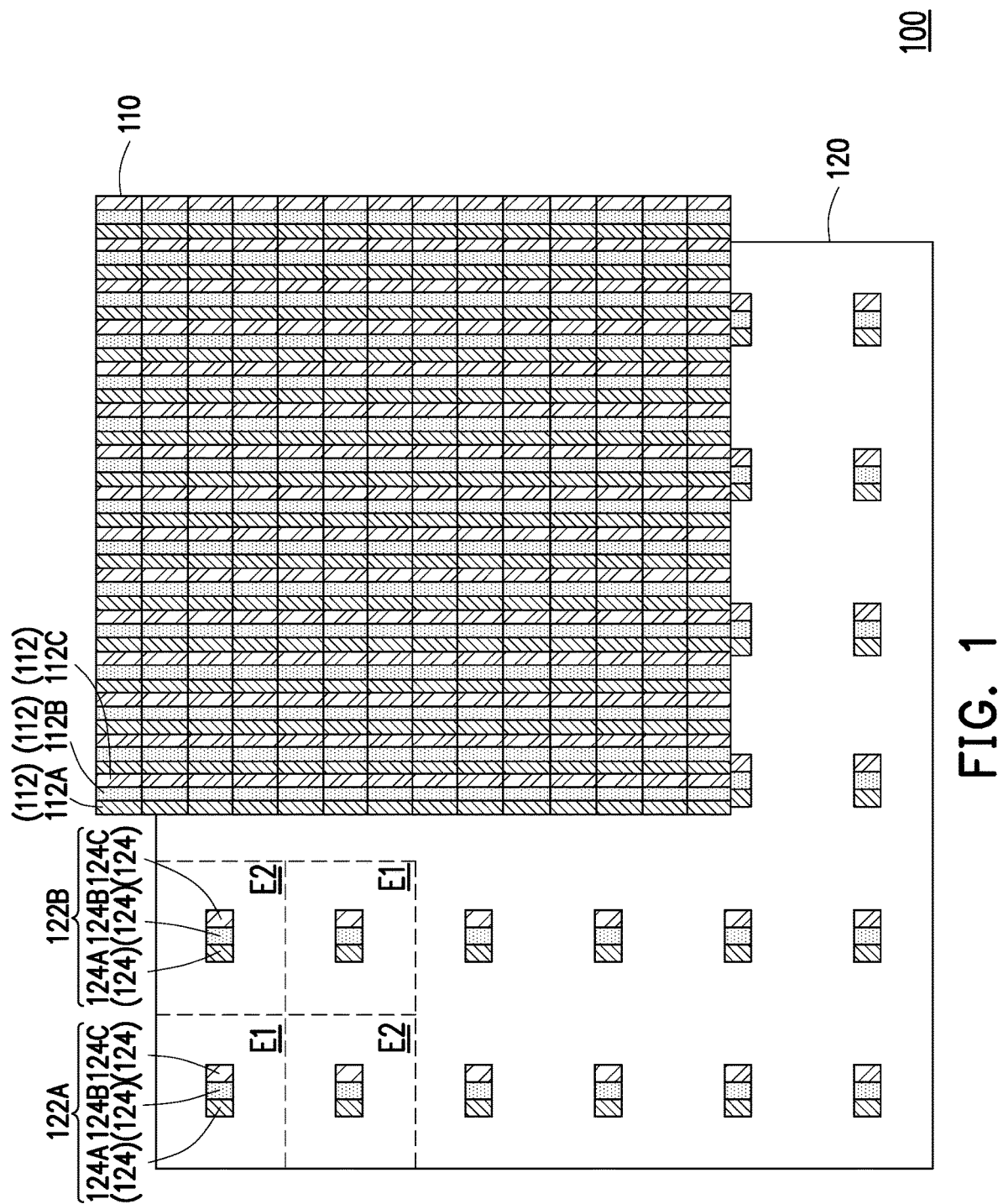
FIG. 1 is a schematic diagram of an electronic device of some embodiments of the disclosure.

Hereinafter, reference will be made in detail to exemplary embodiments of the disclosure, and examples of the exemplary embodiments are illustrated in the figures. Wherever possible, the same reference numerals are used in the figures and the descriptions to refer to the same or similar portions.

FIG. 1 is a schematic diagram of an electronic device according to an embodiment of the disclosure. In FIG. 1, an electronic device 100 includes a display panel 110 and a light source module 120. The arrangement of the display panel 110 and the light source module 120 may be that the display panel 110 is located between the light source module 120 and a user who wants to view a display picture. Therefore, the light source module 120 may be understood as being disposed at the back side of the display panel 110 and referred to as a "back" light source. The light source module 120 may provide light (that is, display light) emitted toward the display panel 110, and the display panel 110 may regionally adjust the amount of display light that may pass through so that the user may see pictures with different brightness in different regions, thus achieving a display function. The display panel 110 may be a transmissive display panel. In some embodiments, the display panel 110 may be a liquid-crystal display panel, but is not limited thereto.

The display panel 110 may include a plurality of display pixels 112, and the display pixels 112 are arranged in an array. In some embodiments, each of the display pixels 112 may include a driving circuit (not shown), a display medium (not shown), and a corresponding color light filter layer (not shown). The driving circuit may generate a driving electric field to drive the display medium, the driven display medium may control the amount of light transmission of each of the display pixels 112, and the color light filter layer may achieve the display color to be presented by each of the display pixels 112. The display medium may include a liquid crystal, and the color light filter layer may include red, green, blue, etc., filter layers, but is not limited thereto. In the present embodiment, the individual display pixels 112 may be configured to control the display of a single color. For example, the display pixels 112 may be divided into red display pixels 112A, green display pixels 112B, and blue display pixels 112C, but are not limited thereto. In some embodiments, each of the display pixels 112 may not include a color light filter layer, and the display color of each of the display pixels 112 may be determined by other methods.

The light source module 120 includes a first group of light-emitting units 122A and a second group of light-emitting units 122B that are alternately arranged. Specifically, the light source module 120 may be divided into alternately arranged first light-emitting regions E1 and second light-emitting regions E2, and the first group of light-emitting units 122A and the second group of light-emitting units 122B are respectively disposed in the first light-emitting regions E1 and the second light-emitting regions E2. The first group of light-emitting units 122A and the second group of light-emitting units 122B each include one or a plurality of light-emitting units 124, and in the present embodiment, the light-emitting units 124 disposed in the first light-emitting regions E1 are the first group of light-emitting units 122A, and the light-emitting units 124 disposed in the second light-emitting regions E2 are the second group of light-emitting units 122B. In addition, the light-emitting units 124 may include light-emitting units 124A, light-emitting units 124B, and light-emitting units 124C of different colors. Specifically, the light-emitting units 124 in the first group of light-emitting units 122A may include the light-emitting units 124A, the light-emitting units 124B, and the light-emitting units 124C. Similarly, the light-emitting units 124 in the second group of light-emitting units 122B may also include the light-emitting units 124A, the light-emitting units 124B, and the light-emitting units 124C. In other words, the first group of light-emitting units 122A and the second group of light-emitting units 122B may have the same light-emitting unit layout. In addition, the light-emitting units 124A, the light-emitting units 124B, and the light-emitting units 124C may respectively emit red, green, and blue light, but are not limited thereto.

The light-emitting units 124 in the light source module 120 are a point light source. In some embodiments, each of the light-emitting units 124 may be a mini light-emitting diode or a micro light-emitting diode, but is not limited thereto. Each of the light-emitting units 124 may be matched with a specified number and layout of display pixels 112, so that the electronic device 100 presents different display pictures in different view fields, so as to achieve a stereoscopic display effect, or a Kirameki display effect, and/or a multi-view display effect.

Moreover, the first group of light-emitting units 122A and the second group of light-emitting units 122B may alternately emit light under a stereoscopic display operation, and the display pixels 112 alternately receive light from the first group of light-emitting units 122A and the second group of light-emitting units 122B. For example, the process for the electronic device 100 to display one picture frame may include a first mode and a second mode. In the first mode, the first group of light-emitting units 122A emit light and the second group of light-emitting units 122B are turned off. At the same time, in the first mode, the electronic device 100 may present a corresponding first view field image information. Then, in the second mode, the first group of light-emitting units 122A are turned off and the second group of light-emitting units 122B emit light. At the same time, in the second mode, the electronic device 100 may present a second view field image information. The first view field image information presented by the electronic device 100 may be transmitted to a corresponding first view field, and the second view field image information presented by the electronic device 100 may be transmitted to a second view field different from the first view field. In this way, two images with different view fields may be displayed within the display time of one picture frame, thus helping to improve display resolution. In some embodiments, in order to achieve the required display effect, the light source module 120 may turn on all the light-emitting units 124 without having to emit light in the first mode and the second mode. For example, when the electronic device 100 performs a flat display operation, the light source module 120 may turn on all the light-emitting units 124 without grouping to emit light.

In order to achieve the required brightness of the light source when implementing the stereoscopic display operation in the first mode and the second mode, the light source module 120 may be driven and controlled to make each of the light-emitting units 124 emit light with enhanced luminous intensity. Therefore, under the interleaving of the first mode and the second mode, the equivalent brightness of the display picture may be close to or substantially equal to the expected brightness. For example, if all the light-emitting units 124 in the first group of light-emitting units 122A and the second group of light-emitting units 122B emit light with a specified luminous intensity (for example, Id) at the same time in the time of one picture frame, the required display brightness may be achieved. In the time of one picture frame, when the first group of light-emitting units 122A and the second group of light-emitting units 122B alternately emit light, the turned-on light-emitting units 124 may choose to emit light with a luminous intensity of 2 times Id. In this way, although the time that each of the light-emitting units 124 is turned on is ½ within the time of one picture frame, after the two modes are alternately executed, the equivalent brightness provided by the light source module 120 may still meet the original setting. In other words, when the time of displaying one picture frame of the electronic device 100 is divided into N modes, and in each mode, 1/N of the light-emitting units 124 are turned on, the light source module 120 may control the luminous intensity of each of the light-emitting units 124 to emit light with N times the luminous intensity, thereby providing an ideal equivalent light source. N is a positive integer here. In other embodiments, for example, when the electronic device performs stereoscopic display, the time of one picture is divided into two modes, and the brightness of each of the first and second light-emitting groups is twice that of a flat display.

FIG. 2 and FIG. 3 are schematic diagrams of a display method of an electronic device in different display modes of an embodiment of the disclosure. FIG. 2 is used to illustrate a schematic example of the electronic device 100 in the first mode, and FIG. 3 is used to illustrate a schematic example of the electronic device 100 in the second mode. In FIG. 2 and FIG. 3, the display panel 110 and the light source module 120 are stacked on top of each other. Both the first group of light-emitting units 122A and the second group of light-emitting units 122B in the light source module 120 are configured to emit light toward the display panel 110. The first group of light-emitting units 122A may include the light-emitting units 124A, 124B, and 124C of three different colors, as are the second group of light-emitting units 122B, but are not limited thereto. The layout and arrangement of the first group of light-emitting units 122A and the second group of light-emitting units 122B and the layout and arrangement of each of the display pixels 122 in the display panel 110 are as provided in FIG. 1. In the first mode presented in FIG. 2, the first group of light-emitting units 122A are turned on and the first group of light-emitting units 122B are turned off. Therefore, the image presented by the electronic device 100 is composed of a light L122A emitted by the first group of light-emitting units 122A. In the second mode presented in FIG. 3, the first group of light-emitting units 122A are turned off and the second group of light-emitting units 122B are turned on, so that the image presented by the electronic device 100 is composed of a light L122B emitted by the second group of light-emitting units 122B.

In order to facilitate the understanding of the display operation of the electronic device 100, two display pixels 112A1 and 112A2 in the display panel 110 are used for specific description below. In addition, the picture color presented by the display pixel 112A1 and the display pixel 112A2 is the same as the luminous color of the light-emitting units 124A. In the first mode of FIG. 2, the region of the electronic device 100 corresponding to the display pixel 112A1 may display a first view field image information VA1, and the region of the electronic device 100 corresponding to the display pixel 112A2 may display another first view field image information VB1. At the same time, in the first mode, the first group of light-emitting units 122A are turned on and the second group of light-emitting units 122B are turned off. In this way, based on the light L122A emitted by the first group of light-emitting units 122A, the first view field image information VA1 and the first view field image information VB1 may be respectively transmitted to different view fields along different angle of view directions to provide images to corresponding view fields. For example, the first view field image information VA1 presented in the region of the electronic device 100 corresponding to the display pixel 112A1 may be transmitted toward a view field direction FA1, and the first view field image information VB1 presented in the region of the electronic device 100 corresponding to the display pixel 112A2 may be transmitted toward a view field direction FB1. As a result, the electronic device 100 may present different image content in different view fields (for example, the view field direction FA1 and the view field direction FB1), thus achieving a stereoscopic display effect, a Kirameki display effect, and/or a multi-view display effect.

Next, in the second mode of FIG. 3, the first group of light-emitting units 122A are turned off, and the second group of light-emitting units 122B are turned on. At the same time, the region of the electronic device 100 originally presenting the first view field image information VA1 is updated to present a second view field image information VA2, and the region originally presenting the first view field image information VB1 is updated to present a second view field image information VB2. As a result, based on the light L122B emitted by the second group of light-emitting units 122B, the second view field image information VA2 and the second view field image information VB2 may be respectively transmitted toward a view field direction FA2 and a view field direction FB2 to provide images to the corresponding view fields. As a result, the electronic device 100 may present different image content in different view fields (for example, the view field direction FA2 and the view field direction FB2), thus achieving a stereoscopic display effect, a Kirameki display effect, and/or a multi-view display effect. Moreover, while the image information presented by the display pixel 112A1 is transmitted toward the view field direction FA2 in the second mode, the image information presented by other display pixels (for example, a display pixel 112A3) on the display panel 110 is transmitted toward the view field direction FA1 in the second mode. Therefore, regardless of the mode, display light is transmitted in each of the view field directions FA1, FA2, FB1, FB2, and a complete picture may be constructed.

For ease of description, FIG. 3 presents the view field direction FA1 and the view field direction FB1 with dashed lines. But in fact, in the second mode of FIG. 3, there is no light transmitted toward the view field direction FA1 and passing through the display pixel 112A1, and there is no light transmitted toward the view field direction FB1 and passing through the display pixel 112A2. According to FIG. 2 and FIG. 3, since the first mode and the second mode respectively turn on different groups of light-emitting units, the first view field image information VA1 and the second view field image information VA2 presented by the single display pixel 112A1 are transmitted to different view fields along the different view field directions FA1 and FA2. Similarly, the first view field image information VB1 and the second view field image information VB2 presented by the single display pixel 112A2 are transmitted to different view fields along the different view field directions FB1 and FB2. In this way, the same display pixel 112A1 or 122A2 may be configured to provide image information to at least two view fields with different spatial positions, thus helping to improve the display resolution of the electronic device 100. In addition, the display pixels 112A1 and 112A2 transmit the first view field image information VA1 and VB1 using the light L122A of the first group of light-emitting units 122A in the first mode without interference from the light L122B of the second group of light-emitting units 122B. Similarly, the display pixels 112A1 and 112A2 transmit the second view field image information VA2 and VB2 using the light L122B of the second group of light-emitting units 122B in the second mode without interference from the light L122A of the first group of light-emitting units 122A. In other words, the light transmitted along the view field direction FA1 and the light transmitted along the view field direction FA2 do not pass through the same display pixel 112A1 at the same time, and the light transmitted along the view field direction FB1 and the light transmitted along the view field direction FB2 do not pass through the same display pixel 112A2 at the same time. This helps to reduce the crosstalk of image light in different view fields to provide a good stereoscopic display effect, a Kirameki display effect, and/or a multi-view display effect.

Figure 4:
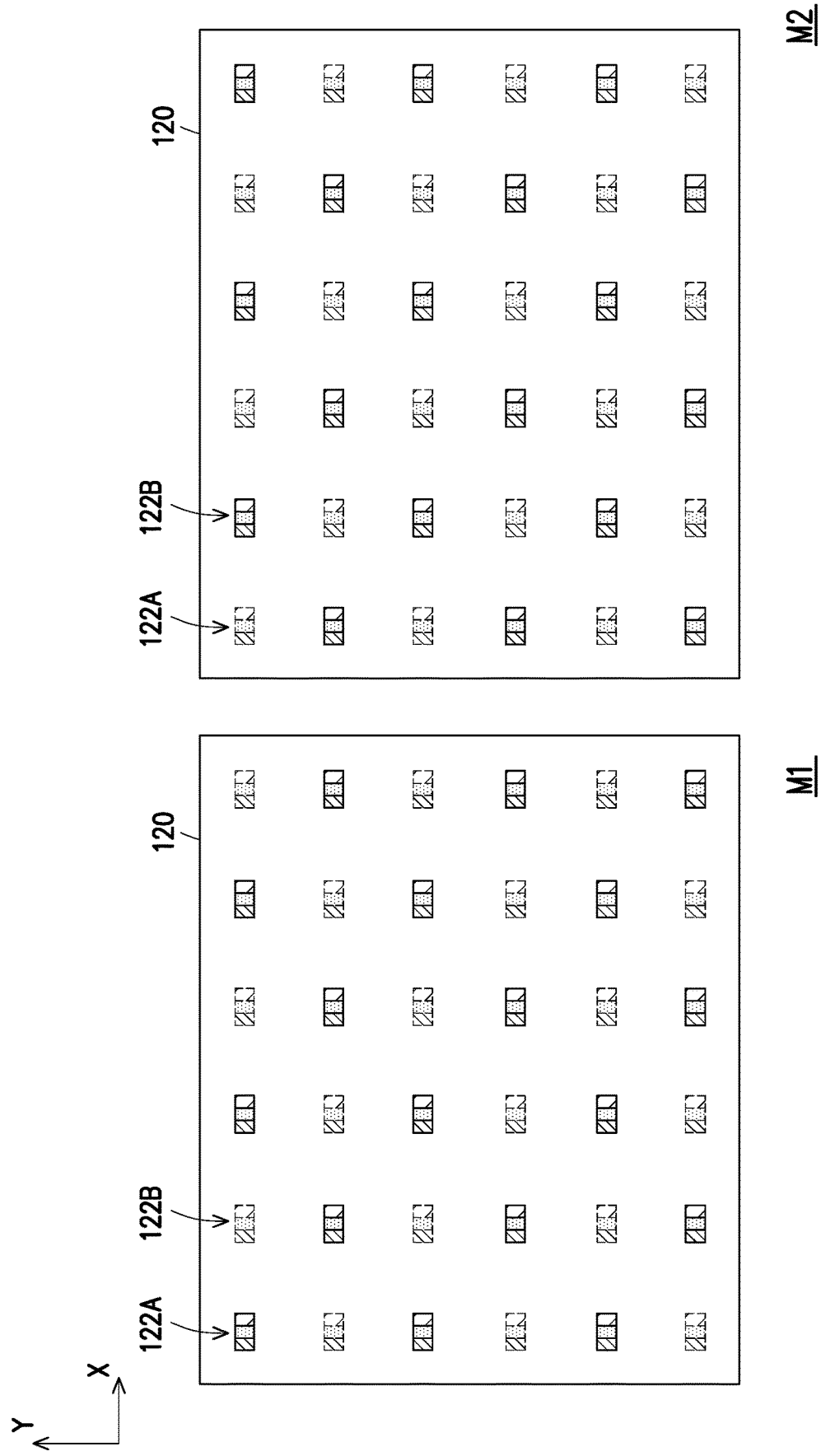
FIG. 4 is a schematic diagram of an operation mode of a light source module in a display method of an electronic device of an embodiment of the disclosure.

FIG. 4 is a schematic diagram of an operation mode of a light source module of an electronic device of an embodiment of the disclosure. FIG. 4 shows that the first group of light-emitting units 122A and the second group of light-emitting units 122B are alternately arranged in an array along the row direction and the column direction. In a first mode M1, the first group of light-emitting units 122A are all represented by solid lines, and the second group of light-emitting units 122B are all represented by dashed lines to present a state where the first group of light-emitting units 122A are all turned on and the second group of light-emitting units 122B are all turned off. Similarly, in a second mode M2, the first group of light-emitting units 122A are all represented by dashed lines and the second group of light-emitting units 122B are all represented by solid lines to present a state where the first group of light-emitting units 122A are all turned off and the second group of light-emitting units 122B are all turned on. The first mode M1 of FIG. 4 may correspond to the state of FIG. 2 and the second mode M2 of FIG. 4 may correspond to the state of FIG. 3, but are not limited thereto. The first group of light-emitting units 122A and the second group of light-emitting units 122B are alternately arranged in both the X direction and the Y direction, but are not limited thereto. In other embodiments, the first group of light-emitting units 122A may be arranged in the same row (X direction), the second group of light-emitting units 122B may be arranged in the same row (X direction), and the first group of light-emitting units 122A and the second group of light-emitting units 122B are alternately disposed in the Y direction. Alternatively, the first group of light-emitting units 122A may be arranged in the same column (Y direction), the second group of light-emitting units 122B may be arranged in the same column (Y direction), and the first group of light-emitting units 122A and the second group of light-emitting units 122B are alternately disposed in the X direction.

Figure 5:
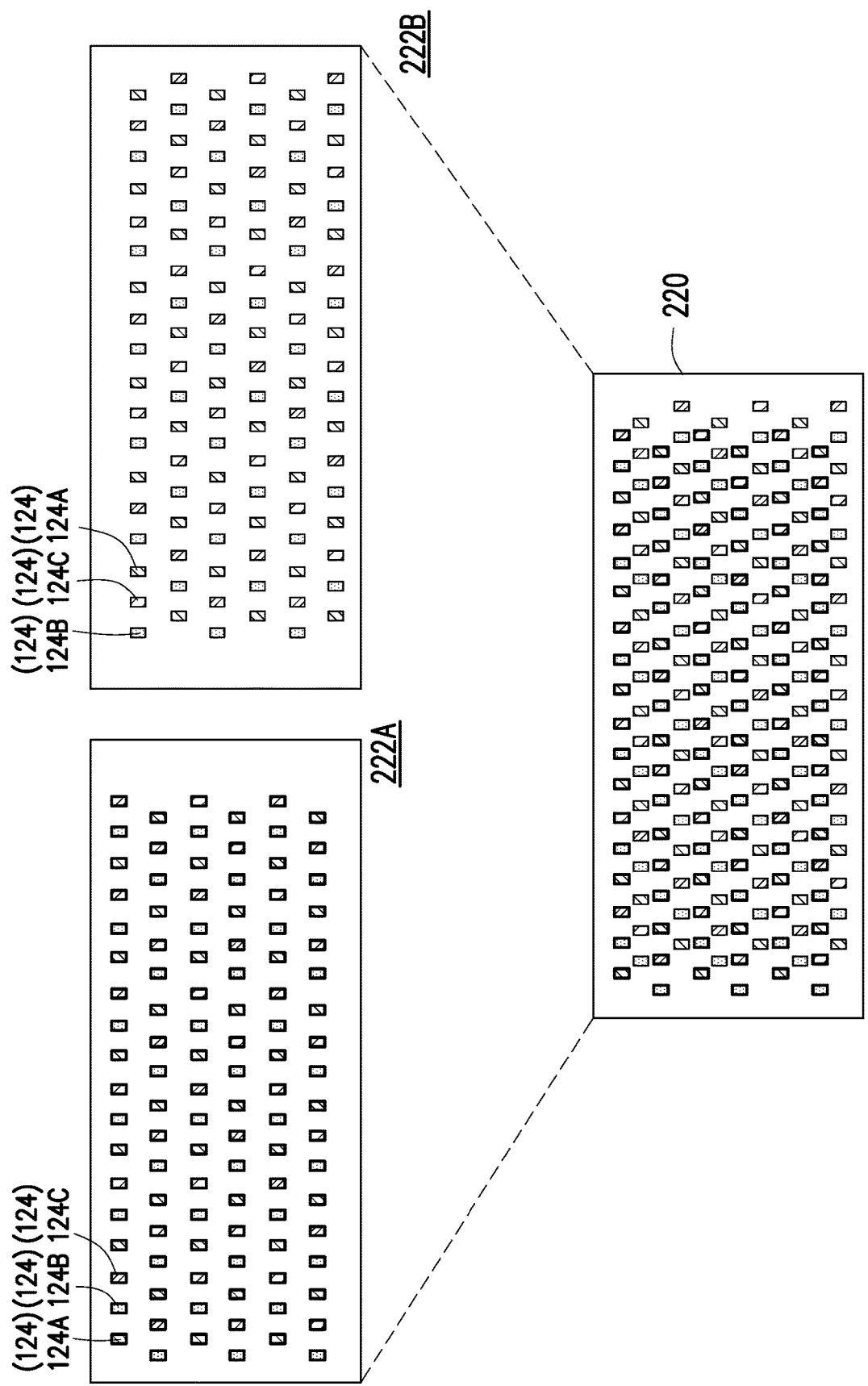
FIG. 5 is a schematic diagram of a light source module of an electronic device of another embodiment of the disclosure.

FIG. 5 is a schematic diagram of a light source module of an electronic device of another embodiment of the disclosure. A light source module 220 of FIG. 5 may be configured to replace the light source module 120 of FIG. 1. In other words, the light source module 220 may be disposed at the back side of the display panel 110 of FIG. 1. The light source module 220 may include a first group of light-emitting units 222A (represented by a thicker black frame) and a second group of light-emitting units 222B (represented by a thinner black frame). The first group of light-emitting units 222A includes the plurality of light-emitting units 124 and the second group of light-emitting units 222B also includes the plurality of light-emitting units 124. The light-emitting units 124 of the first group of light-emitting units 222A are arranged in a delta arrangement in the light source module 220, and the light-emitting units 124 of the second group of light-emitting units 222B are also arranged in the light source module 220 in a triangular arrangement. At the same time, the light-emitting units 124 of the first group of light-emitting units 222A and the light-emitting units 124 of the second group of light-emitting units 222B are shifted from each other without overlapping. The light-emitting units 124 of the first group of light-emitting units 222A may include the light-emitting units 124A, 124B, and 124C of different colors, and the light-emitting units 124 of the second group of light-emitting units 222B may also include the light-emitting units 124A, 124B, and 124C of different colors, so as to provide a light source required for a full-color picture. Each of the light-emitting units 124 may be a directional light-emitting unit, such as a mini light-emitting diode, but is not limited thereto.

The light source module 220 disposed at the back side of the display panel 110 in FIG. 1 may constitute an alternative embodiment of the electronic device 100. When different image information need to be provided in different view fields for a desired display effect (for example, a stereoscopic display effect), the operation mode of the light source module 220 may include alternately making the first group of light-emitting units 222A and the second group of light-emitting units 222B emit light. In the first mode, the first group of light-emitting units 222A of the light source module 220 may be turned on and the second group of light-emitting units 222B may be turned off. However, in order to achieve other display effects (such as a flat display effect), the operation mode of the light source module 220 may make the first group of light-emitting units 222A and the second group of light-emitting units 222B emit light at the same time without distinguishing the light-emitting sequence. Moreover, in some embodiments, the light-emitting units 124 of the light source module 220 may be divided into three or more groups, and the light-emitting units 124 of these groups may be turned on at different times. Therefore, the operation mode of the light source module 220 of the disclosure is not limited to two modes.

Figure 6:
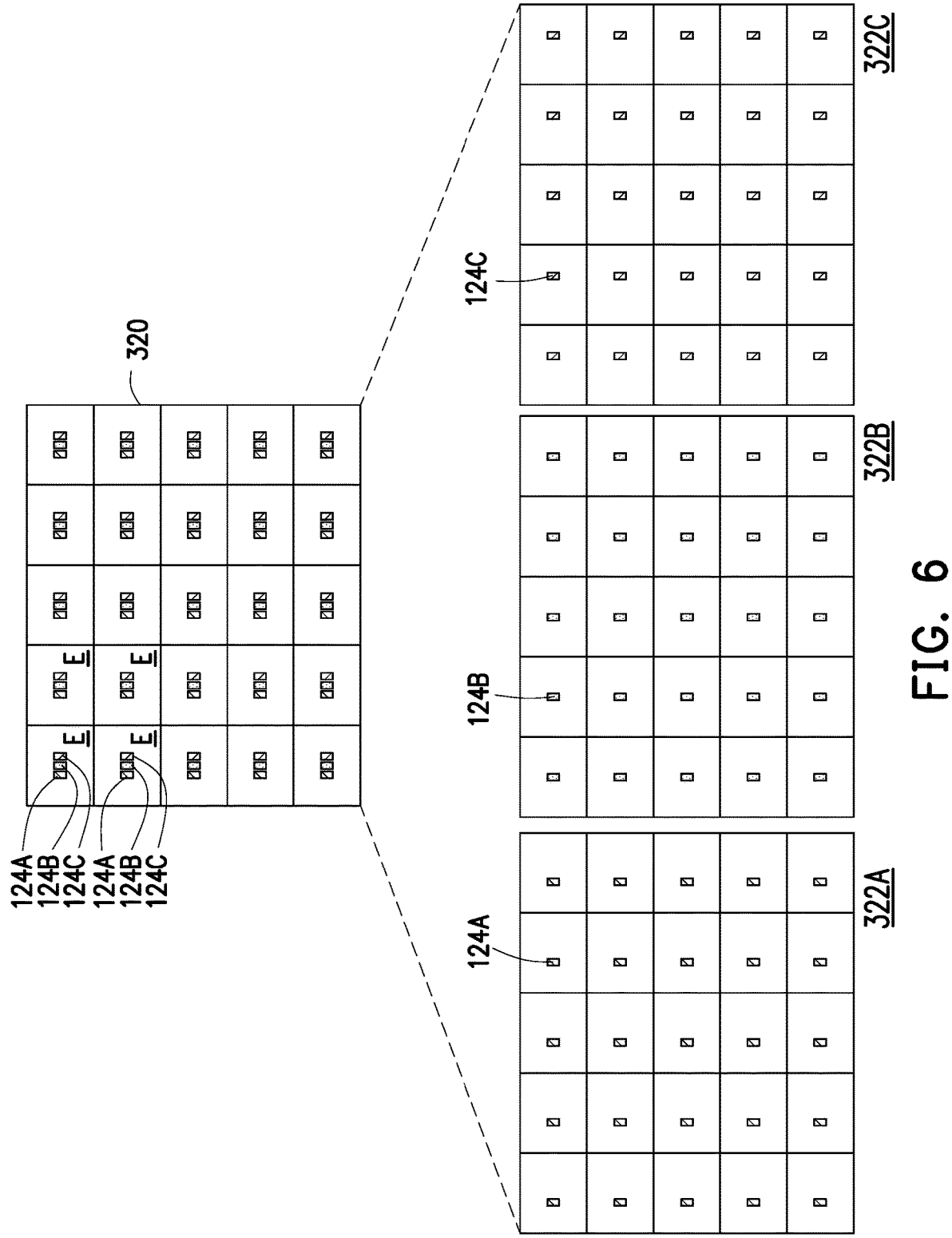
FIG. 6 is a schematic diagram of a light source module of an electronic device of another embodiment of the disclosure.

FIG. 6 is a schematic diagram of a light source module of an electronic device of another embodiment of the disclosure. In FIG. 6, a light source module 320 has a plurality of light-emitting regions E, and each of the light-emitting regions E is provided with the light-emitting units 124A, 124B, and 124C of three different colors. In other words, the light source module 320 includes light-emitting units of three colors, wherein the three colors may be red, green, and blue, but are not limited thereto. In addition, the light-emitting units 124A, 124B, and 124C may be divided into three groups according to luminous color. For example, all the light-emitting units 124A may be regarded as a first group of light-emitting units 322A, all the light-emitting units 124B may be regarded as a second group of light-emitting units 322B, and all the light-emitting units 124C may be regarded as a third group of light-emitting units 322C.

The light source module 320 may be applied to the electronic device 100 of FIG. 1 to replace the light source module 120 of FIG. 1. In the present embodiment, the first group of light-emitting units 322A, the second group of light-emitting units 322B, and the third group of light-emitting units 322C may be operated independently. When applied to the electronic device 100, the light source module 320 may be operated in a time division multiplexing control manner. For example, the operation mode of the light source module 320 may include making the first group of light-emitting units 322A, the second group of light-emitting units 322B, and the third group of light-emitting units 322C emit light sequentially and alternately in the time of one picture frame. When the first group of light-emitting units 322A are turned on to emit light, the second group of light-emitting units 322B and the third group of light-emitting units 322C are both turned off. At this time, the display panel disposed in front of the light source module 320 may display the image information of the first color. Similarly, when the second group of light-emitting units 322B are turned on, the display panel disposed in front of the light source module 320 may display image information of the second color, and when the third group of light-emitting units 322C are turned on, the display panel disposed in front of the light source module 320 may display image information of the third color. In this way, the display panel disposed in front of the light source module 320 may optionally not have a color light filter layer or a similar light filter structure and still achieve a full-color display effect. In addition, the three-color display light is emitted in a time-division manner, thus helping to enhance the full-color effect of the display picture, and the interference between different colors may be reduced.

The operation method of the light source module 320 may make the light-emitting units 124A, 124B, and 124C of different colors emit light at different timings, and may also make the light-emitting units of adjacent light-emitting regions E alternately emit light. That is to say, the operation mode presented in FIG. 4 may be applied to the light-emitting operation of the three groups of light-emitting units of FIG. 6. For example, the first group of light-emitting units 322A may be turned on in a manner such that the light-emitting units 124A in two adjacent light-emitting regions E alternately emit light, the second group of light-emitting units 322B may be turned on in a manner such that the light-emitting units 124B in two adjacent light-emitting regions E alternately emit light, and the third group of light-emitting units 322C may be turned on in a manner such that the light-emitting units 124C in two adjacent light-emitting regions E alternately emit light. In this way, image light of different colors not interfere with each other, and the image light of adjacent light-emitting regions E may also be provided in a time-division manner to reduce interference with each other. In the alternate light emission operation mode, the time that each of the light-emitting units 124A, 124B, and 124C is turned on is shortened. Therefore, the light source module 320 may increase the luminous intensity of each of the light-emitting units 124A, 124B, and 124C as needed when they are turned on to achieve an ideal light source effect. For example, if the time that each of the light-emitting units 124A, 124B, and 124C is turned on is shortened to 1/N of the preset lighting time (time of one picture frame), then the light source module 320 may increase the luminous intensity of each of the light-emitting units 124A, 124B, and 124C when they are turned on to N times the preset intensity, but is not limited thereto.

Figure 7:
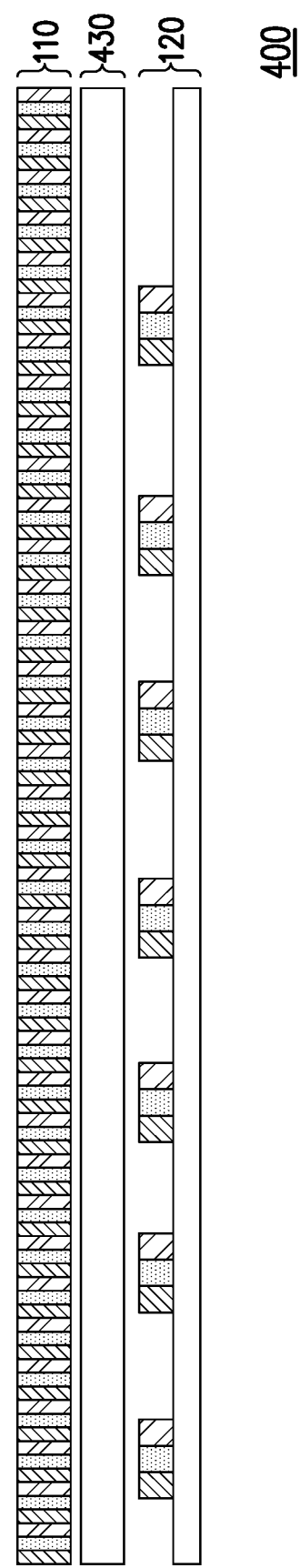
FIG. 7 is a schematic diagram of an electronic device of another embodiment of the disclosure.

FIG. 7 is a schematic diagram of an electronic device of another embodiment of the disclosure. An electronic device 400 of FIG. 7 includes the display panel 110, the light source module 120, and an electrically controlled diffuser 430 disposed between the display panel 110 and the light source module 120, wherein the display panel 110 and the light source module 120 are as provided in the related description of FIG. 1, and the light source module 120 may be replaced by the light source module 220 of FIG. 5 or the light source module 320 of FIG. 6. In addition, the operation method of the light source module 120, 220, or 320 may be applied to the display method of the electronic device 400 of FIG. 7. The electronic device 400 is different from the electronic device 100 mainly in that the electronically controlled diffuser 430 is additionally provided.

In the present embodiment, the electronic device 400 may provide different pictures in different view fields to achieve a stereoscopic display effect, but may also provide a flat display effect. The electronically controlled diffuser 430 may present different optical states in a stereoscopic display mode and a flat display mode. For example, the electronically controlled diffuser 430 may switch between a light-transmitting state and a diffused state. In the stereoscopic display mode, the electronically controlled diffuser 430 may be controlled to present a light-transmitting state. At this time, the light provided by the light source module 120 may directly pass through the electronically controlled diffuser 430 without being refracted, scattered, or adjusted. Therefore, in the stereoscopic display mode, the operation of the display panel 110 and the light source module 120 may be as shown in any of FIG. 2 to FIG. 6. In the flat display mode, the electronically controlled diffuser 430 may be controlled to present a diffused state, such as a foggy state. At this time, the light provided by the light source module 120 may be emitted in a more divergent manner by the diffusion effect of the electronically controlled diffuser 430, so that the light transmitted by each of the pixels 112 on the display panel 110 may be observed in the viewing angle, indicating that the electronic device 100 presents the same display picture in different view fields, that is, a flat display effect. In some embodiments, the electronically controlled diffuser 430 may be a liquid-crystal panel, such as a polymer-dispersed type liquid-crystal panel to achieve the function of state switching, but is not limited thereto.

Figure 8:
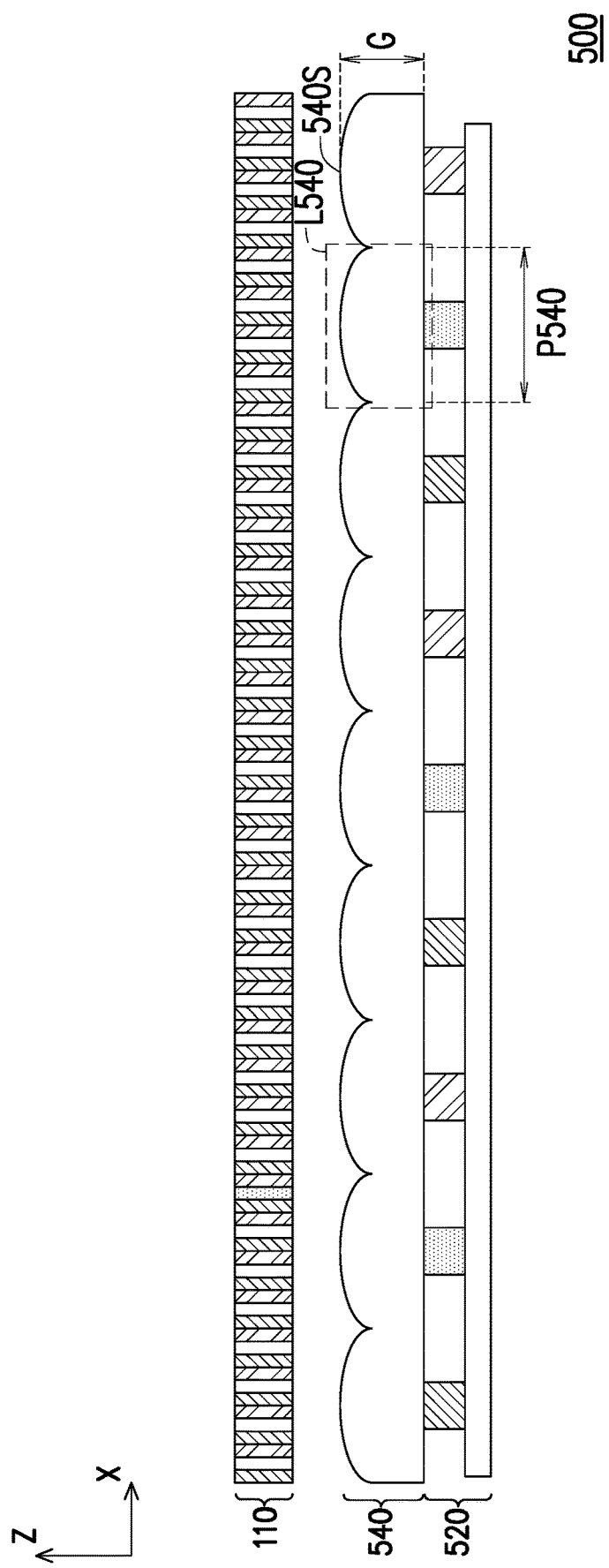
FIG. 8 is a schematic diagram of an electronic device of another embodiment of the disclosure.
Figure 9:
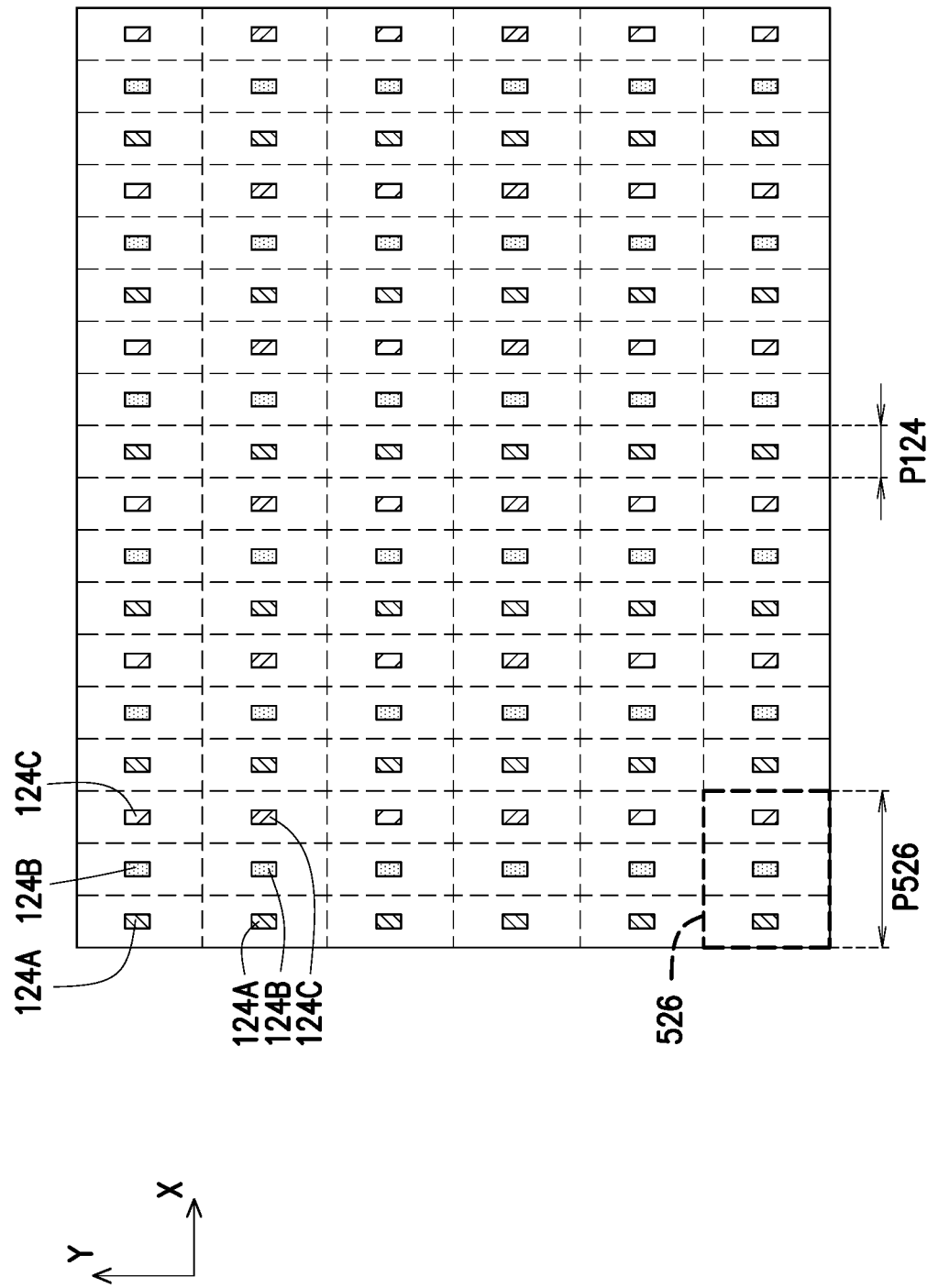
FIG. 9 is a schematic plan view of a light source module in the electronic device of FIG. 8.

FIG. 8 is a schematic diagram of an electronic device of another embodiment of the disclosure, and FIG. 9 is a schematic plan view of a light source module in the electronic device of FIG. 8. An electronic device 500 of FIG. 8 includes the display panel 110, a light source module 520, and a lens array 540 disposed between the display panel 110 and the light source module 520 in the Z direction, wherein the display panel 110 is as provided in the related description of FIG. 1. In the present embodiment, referring to FIG. 8 and FIG. 9, the light source module 520 includes the plurality of light-emitting units 124A, 124B, and 124C, wherein the light-emitting units 124A, 124B, and 124C respectively emit light of different colors. The light-emitting units 124A of the same color are arranged in a row in the Y direction, the light-emitting units 124B of the same color are arranged in a row in the Y direction, and the light-emitting units 124C of the same color are arranged in a row in the Y direction. At the same time, the rows of the light-emitting units 124A, the rows of the light-emitting units 124B, and the rows of the light-emitting units 124C are sequentially arranged in the X direction. Therefore, adjacent light-emitting units arranged along the Y direction are all light-emitting units of the same color, and adjacent light-emitting units arranged along the X direction are of different colors. Since the light-emitting units 124A, 124B, and 124C have different light-emitting colors, every three adjacent light-emitting units 124A, 124B, and 124C may be regarded as one light-emitting pixel 526 configured to provide a full-color light source. In some embodiments, an interval P124 of the light-emitting units 124A, 124B, and 124C in the X direction may be substantially 0.28 to 0.38 times an interval P526 of adjacent light-emitting pixels 526.

The lens array 540 disposed between the display panel 110 and the light source module 120 includes, for example, a plurality of lenticular lens structures L540, and each of the lenticular lens structure L540 may be extended along the Y direction. An interval P540 of the lenticular lens structures L540 in the X direction may be substantially equal to the interval P124 of the light-emitting units 124A, 124B, and 124C in the X direction. In this way, in the X direction, each of the lenticular lens structures L540 may correspond to one light-emitting unit 124A, 124B, or 124C. In addition, a maximum distance G between a lens curved surface 540S of each of the lenticular lens structures L540 and the corresponding light-emitting unit 124A, 124B, or 124C may be equal to the focal length of the lens curved surface 540S. In some embodiments, the light-emitting surface of the light-emitting unit 124A, 124B, or 124C may be disposed on the focal point of the corresponding lenticular lens structure L540, but is not limited thereto. As a result, the lens array 540 helps to improve the light-emitting collimation of each of the light-emitting units 124A, 124B, or 124C, so that the light source module 520 may provide an ideal directional light-emitting effect.

In the present embodiment, the electronic device 500 may provide a stereoscopic display effect. In the stereoscopic display mode, the light-emitting units 124A, the light-emitting units 124B, and the light-emitting units 124C may emit light in sequence, that is, the operation method similar to that described in FIG. 6 is used for implementation. In this way, the light transmitted toward different view fields do not readily interfere with each other, thus helping to improve the quality of the stereoscopic display effect.

Figure 10:
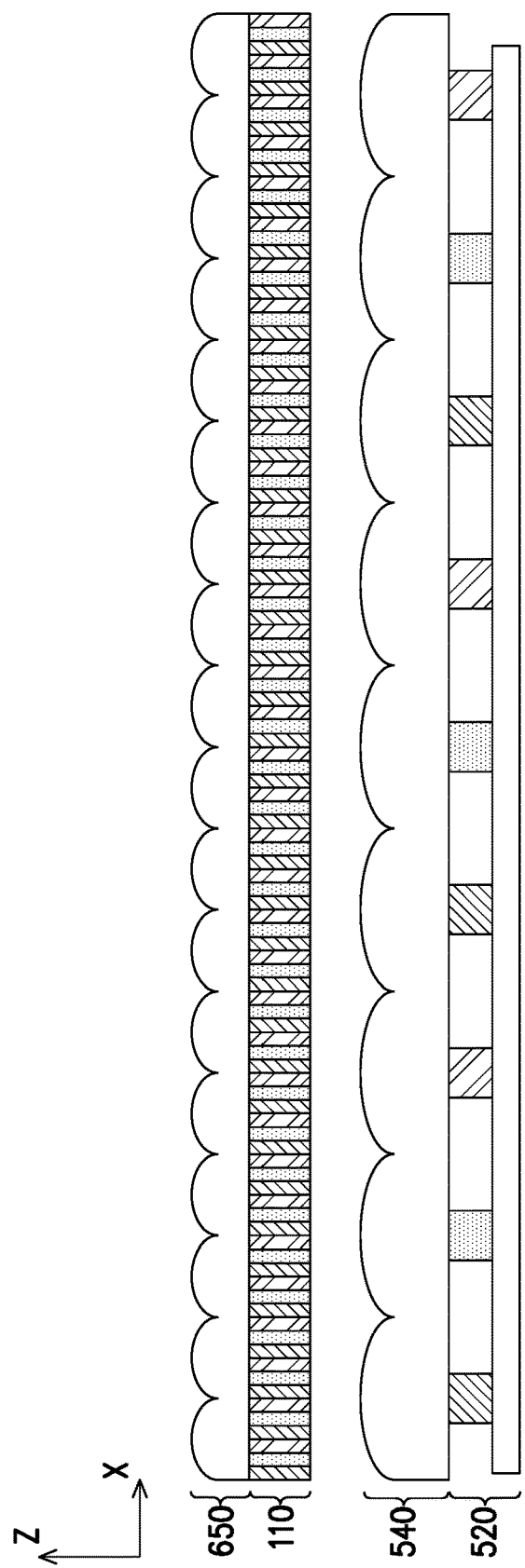
FIG. 10 is a schematic diagram of an electronic device of still another embodiment of the disclosure.

FIG. 10 is a schematic diagram of an electronic device of still another embodiment of the disclosure. In FIG. 10, an electronic device 600 includes the display panel 110, the light source module 520, the lens array 540, and another lens array 650, wherein the structure, layout, function, and operation method of the display panel 110, the light source module 520, and the lens array 540 are as provided in the description of FIG. 8 and is not repeated herein. In other words, the electronic device 600 is different from the electronic device 500 in that the electronic device 600 further includes the lens array 650. It may be seen from FIG. 9 that the display panel 110 is disposed between the lens array 650 and the light source module 520. Specifically, the light source module 520, the lens array 540, the display panel 110, and the lens array 650 are sequentially stacked in the Z direction.

The lens array 650 is disposed between the display panel 110 and the user, and the lens density of the lens array 650 may be smaller than the lens density of the lens array 540. In the present embodiment, the lens density of the lens array 650 may be determined according to the layout density of display pixels in the display panel 110. The lens array 540 located between the light source module 520 and the display panel 110 may be configured to improve the collimation of display light, and the lens array 650 located outside the display panel 110 may be configured to suitably deflect display light so that the display light is transmitted toward the designated view field. In this way, the lens array 650 may help to achieve the picture display of a specific view field. The lens array 650 may have lenticular lens structures. In an embodiment, the extending direction of the lenticular lens structures of the lens array may be intersected with the extending direction of the lenticular lens structures of the lens array 540. In an alternative embodiment, the lens array 650 may be replaced with a light barrier layer (parallax barrier).

Figure 11:
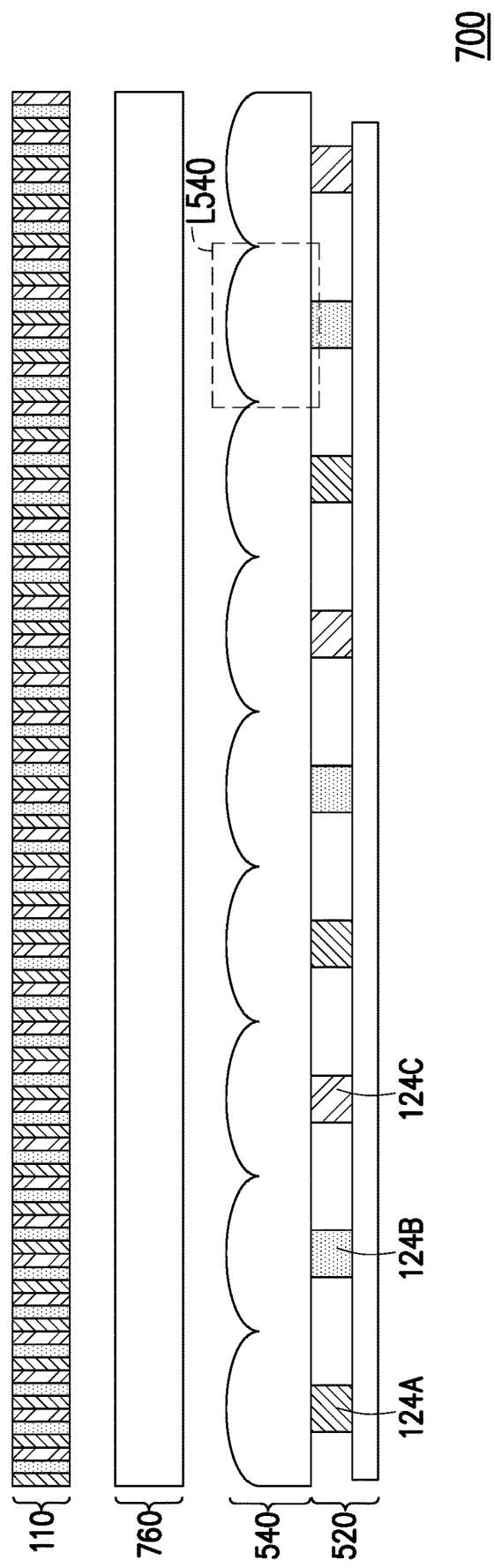
FIG. 11 is a schematic diagram of an electronic device of still yet another embodiment of the disclosure.
Figure 12:
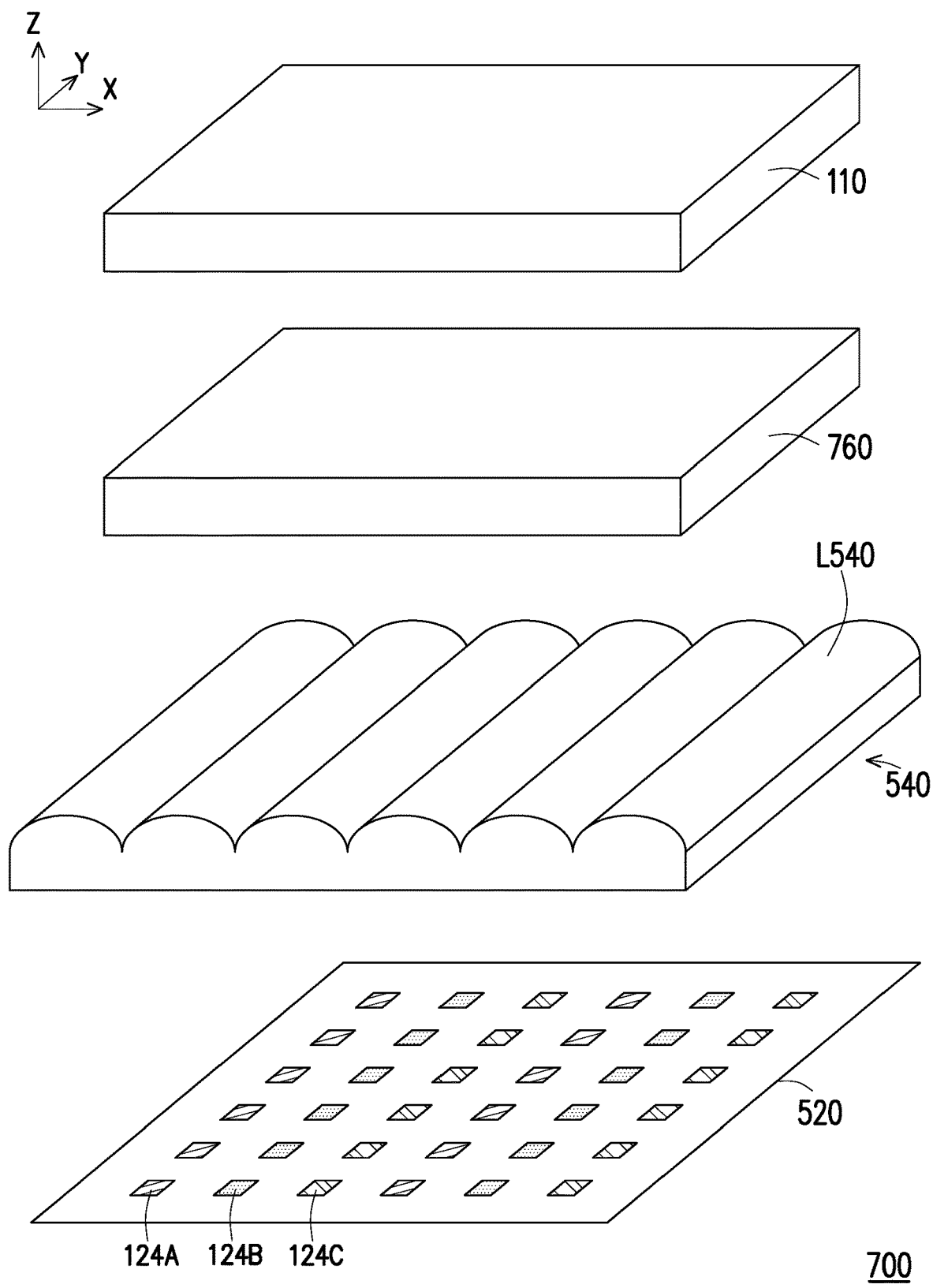
FIG. 12 is an exploded view of the electronic device of FIG. 11.

FIG. 11 is a schematic diagram of an electronic device of yet another embodiment of the disclosure, and FIG. 12 is an exploded view of the electronic device of FIG. 11. In FIG. 11 and FIG. 12, an electronic device 700 includes the display panel 110, the light source module 520, the lens array 540, and a directional diffuser 760, wherein the structure, layout, function, and operation method of the display panel 110, the light source module 520, and the lens array 540 are as provided in the description of FIG. 8 and are not repeated herein. In other words, the difference between the electronic device 700 and the electronic device 500 is that the electronic device 700 further includes the directional diffuser 760, and the directional diffuser 760 is disposed between the lens array 540 and the display panel 110.

In the present embodiment, the lens array 540 includes a plurality of lenticular lens structures L540 arranged along the X direction, and each of the lenticular lens structures L540 is extended along the Y direction. In addition, the light-emitting units 124A, 124B, and 124C in the light source module 520 are respectively arranged in a plurality of rows along the Y direction. The arrangement of the lens array 540 may adjust the light-emitting distribution of display light provided by the light source module 520 in the X direction. However, the display light provided by the light source module 520 is not adjusted by the lens array 540 in the Y direction. In the present embodiment, the directional diffuser 760 may provide a more significant optical diffusion effect in the Y direction, so that the light emitted by the same row of light-emitting units 124A, 124B, or 124C may be more uniformly distributed in the Y direction. In other words, the extending direction of the lenticular lens structures L540 (for example, the Y direction) corresponds to the main diffusion direction (for example, the Y direction) of the directional diffuser 760 (for example, parallel, substantially parallel, or intersecting at a small angle). In some embodiments, the directional diffuser 760 may have a plurality of diffusion structures or diffusion particles, and the shape and distribution of the diffusion structures or the diffusion particles may be designed to provide a more significant diffusion effect in the Y direction. In addition, the directional diffuser 760 may provide a slight diffusion effect or almost no diffusion effect in the X direction. In some embodiments, the directional diffuser 760 may be implemented by a prism sheet.

Based on the above, the electronic device and the display method of an embodiment of the disclosure may group the light-emitting units in the light source module to be turned on to achieve a stereoscopic display effect. Since the light-emitting units are turned on in groups, the same display pixel does not receive light from different directions, thus helping to reduce the crosstalk of image light. Therefore, the electronic device and the display method of the disclosure may provide an ideal display effect and may improve the display quality of a stereoscopic display image.

Lastly, it should be noted that the above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. An electronic device, comprising:
   a display panel comprising a plurality of display pixels; and
   a light source module disposed at a side of the display panel, wherein the light source module comprises a first group of light-emitting units and a second group of light-emitting units that are alternately arranged, wherein the first group of light-emitting units and the second group of light-emitting units emit a light alternately, and each of the plurality of display pixels is adapted to alternately receive the light from the first group of light-emitting units and the second group of light-emitting units, wherein the first group of light-emitting units and the second group of light-emitting units each comprise a plurality of light-emitting units of different colors.

2. The electronic device of claim 1, wherein the first group of light-emitting units and the second group of light-emitting units alternately emit the light under a stereoscopic display operation.

3. The electronic device of claim 1, wherein the first group of light-emitting units and the second group of light-emitting units emit light of different colors.

4. The electronic device of claim 3, wherein at least one light-emitting unit of the first group of light-emitting units and at least one light-emitting unit of the second group of light-emitting units are located in a same light-emitting region.

5. The electronic device of claim 1, further comprising an electronically controlled diffuser disposed between the display panel and the light source module.

6. The electronic device of claim 1, further comprising a lens array disposed between the display panel and the light source module.

7. The electronic device of claim 6, wherein the lens array comprises a plurality of lenticular lens structures.

8. The electronic device of claim 7, further comprising a directional diffuser disposed between the lens array and the display panel, and an extending direction of each of the plurality of lenticular lens structures corresponds to a main diffusion direction of the directional diffuser.

9. The electronic device of claim 1, wherein light-emitting units of the first group of light-emitting units and the second group of light-emitting units are mini light-emitting diodes or micro light-emitting diodes.

10. The electronic device of claim 1, wherein when the first group of light-emitting units emit the light, one of the display pixels displays a first view field image information transmitted toward a first view field direction; and when the second group of light-emitting units emit the light, the one of the display pixels displays a second view field image information transmitted toward a second view field direction.

11. The electronic device of claim 10, wherein the first view field image information is different from the second view field image information.

12. The electronic device of claim 1, wherein when the first group of light-emitting units emit the light, one of the display pixels displays a first view field image information transmitted toward a view field direction; and when the second group of light-emitting units emit the light, another of the display pixels displays a second view field image information transmitted toward the view field direction.

13. The electronic device of claim 1, wherein light-emitting units of the first group of light-emitting units and light-emitting units of the second group of light-emitting units are all arranged in a triangular arrangement and the light-emitting units of the first group of light-emitting units and the light-emitting units of the second group of light-emitting units are shifted from each other.

\* \* \* \* \*